United States Patent
Ma et al.

(10) Patent No.: US 7,102,546 B2
(45) Date of Patent: Sep. 5, 2006

(54) STATE MODULATION METHOD AND APPARATUS FOR INSERTING STATE CONTROL CODES

(75) Inventors: Chang-Po Ma, Hsinchu (TW);
Yung-Chi Yang, Yongkang (TW);
Che-Kuo Hsu, Sanchong (TW);
Sun-How Jiang, Bade (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/244,593

(22) Filed: Oct. 6, 2005

(65) Prior Publication Data

US 2006/0145901 A1    Jul. 6, 2006

(30) Foreign Application Priority Data

Dec. 30, 2004  (TW)  ............... 93141367 A

(51) Int. Cl.
*H03M 7/00*    (2006.01)
(52) U.S. Cl. ........................... 341/59; 341/58
(58) Field of Classification Search ............. 341/50–70
See application file for complete search history.

(56) References Cited

U.S. PATENT DOCUMENTS

| | | | |
|---|---|---|---|
| 6,362,754 B1 * | 3/2002 | Van Dijk et al. ............. | 341/59 |
| 6,456,208 B1 * | 9/2002 | Nazari et al. ................. | 341/59 |
| 6,604,219 B1 | 8/2003 | Lee et al. .................... | 714/769 |

OTHER PUBLICATIONS

Efficient dc-Free RLL Codes for Optical Recording Kee A. Schouhamer Immink, Fellow, IEE, Jin-Yong Kim, Sang-Woon Suh and Seong Keun Ahn 2003 IEEE p. 326-331, no month.

* cited by examiner

*Primary Examiner*—Lam T. Mai

(57) ABSTRACT

A state modulation method and an apparatus for inserting state control codes are provided. To overcome the problems of inefficient control on direct current and low frequency component in conventional state modulation techniques, the disclosed method inserts state control codes in a state modulation method to increase the probability for selection. With multi-level characteristics, the inserted state control codes can provide a plurality of sets of different signals for selection during coding. Thereby, the direct current and low frequency components can be well controlled.

20 Claims, 8 Drawing Sheets

| user data | S1 | next state | S2 | next state | S30 | next state | S31 | next state |
|---|---|---|---|---|---|---|---|---|
| 44 | 00100200000 | 3 | 01000000010 | 2 | 10020000200 | 3 | 10020000200 | 3 |
| 45 | 00200200000 | 3 | 02000000010 | 2 | 20020000200 | 3 | 20020000200 | 3 |
| 46 | 00100100100 | 3 | 01000000020 | 2 | 10010001000 | 3 | 10010001000 | 3 |
| 47 | 00200100100 | 3 | 02000000020 | 2 | 20020002000 | 3 | 20020002000 | 3 |
| 48 | 00100200100 | 3 | 01000000100 | 2 | 10010010000 | 3 | 10010010000 | 3 |
| 49 | 00200200100 | 3 | 02000000100 | 2 | 20020020000 | 3 | 20020020000 | 3 |
| 50 | 00100100200 | 3 | 01000000200 | 2 | 20000000020 | 2 | 10000000010 | 2 |
| 51 | 00200100200 | 3 | 02000000200 | 2 | 20000000200 | 2 | 10000000100 | 2 |
| 52 | 00100200200 | 3 | 01000001000 | 2 | 20000002000 | 2 | 10000001000 | 2 |
| 53 | 00200200200 | 3 | 02000001000 | 2 | 20000020000 | 2 | 10000010000 | 2 |
| 54 | 00000100000 | 2 | 01000002000 | 2 | 20000010010 | 2 | 10000020010 | 2 |
| 55 | 00000200000 | 2 | 02000002000 | 2 | 20000020010 | 2 | 10000010020 | 2 |
| 56 | 00000100010 | 2 | 01000010000 | 2 | 20000010020 | 2 | 10000020020 | 2 |
| 57 | 00000200010 | 2 | 02000010000 | 2 | 10000100000 | 2 | 20000200000 | 2 |
| 58 | 00000100020 | 2 | 01000020000 | 2 | 20000100010 | 2 | 10000200010 | 2 |
| 59 | 00000200020 | 2 | 02000020000 | 2 | 20000200010 | 2 | 10000100020 | 2 |
| 60 | 00000100100 | 2 | 01000010010 | 2 | 20000100020 | 2 | 10000200020 | 2 |
| 61 | 00000200100 | 2 | 02000010010 | 2 | 20000100100 | 2 | 10000200100 | 2 |
| 62 | 00000100200 | 2 | 01000020010 | 2 | 20000200100 | 2 | 10000100200 | 2 |
| 63 | 00000200200 | 2 | 02000020010 | 2 | 20000100200 | 2 | 10000200200 | 2 |

FIG. 2A (Prior Art)

| current state | state control code | next state |
|---|---|---|
| S1 | 0 | S1, S2 |
| S2 | 0 | S30, S31 |
| S30, S31 | 1, 2 | S1 |

401 — current state
402 — state control code
403 — next state
400

STATE MODULATION METHOD AND APPARATUS FOR INSERTING STATE CONTROL CODES

FIELD OF THE INVENTION

The present invention generally relates to an apparatus for signal processing, and a method of forming the same, and more specifically to a state modulation apparatus for inserting control codes and a method of forming the same.

BACKGROUND OF THE INVENTION

A direct current and low frequency component of a considerable amount is usually included in the binary signals read from the data stored in the optical data storage medium. The direct current (DC) and low frequency component may interfere with the server control signals to the optical disk players and may further prevent the data in the optical disk from reading. Therefore, various modulation and storage technologies are developed to control the direct current and low frequency component included in the binary signals read from or written to the data stored in the optical data storage medium.

The multi-level technology is one of the high-capacity optical data storage technologies. The multi-level run length limited (ML-RLL) technology, due to the affinity to the current optical data storage technology, is easier to implement. In practice, the non-return to zero (NRZ) signal is first generated, and then the non-return to zero invert (NRZI) signal is extracted from the NRZ signal using the equation, $NRZI[n+1]=mod(NRZI[n]+NRZ[n+1], level\_number)$, where level_number is the number of levels in use.

FIG. 1 shows the NRZ signal, NRZI signal, and the changes of the digital sum value (DSV). As shown in FIG. 1, with level_number=3, the NRZI signal is at the LV0 level initially. When NRZ=2, the new NRZI signal becomes $mod(0+2, 3)=2$; therefore, the new NRZI signal is at LV2 level. Next, when NRZ=1, the new NRZI signal becomes $mod(2+1, 3)=0$; therefore, the new NRZI signal returns to LV0 level. When NRZ=1 again, the new NRZI signal becomes $mod(0+1, 3)=1$; therefore, the new NRZI signal becomes at LV1 level, and so on. For maintaining the good spectrum characteristics or simplifying the circuit design, it is necessary to define the maximum and the minimum number of consecutive zeros in the NRZ signal. The minimum and the maximum numbers, called the minimum and the maximum of the run length, are denoted as d and k, respectively. For example, (d,k)=(2,8) indicates that at least two consecutive zeros and at most eight zeros must exist between any two non-zero values of the NRZ signal.

To prevent modulated NRZI signal from affecting the low frequency server control signal, the conventional two-level modulation usually uses the digital sum of the NRZI signal obtained by control codes to reduce the low frequency component of the NRZI signal. Theoretically, the smaller the range of the changes of the digital sum, the smaller the low frequency component is. The digital sum of the two-level modulation is defined as the difference of the number of the digits of the NRZI signal at high level and the low level. In the multi-level modulation, a weight is assigned to each level. As shown in FIG. 1, the weight of the three-level NRZI signal is assigned as 1, 0, −1, from top to bottom. If the initial digital sum is 0, the changes of the digital sum at each time point are computed.

To modulate correct NRZ signal, the state modulation is one of the commonly adopted modulation methods. Its main feature is to perform state categorization on the RLL codewords that conform to the (d,k) constrain according to the leading or trailing zeros, and then generate a corresponding table based on the state categories. During modulation, in addition to selecting the corresponding codeword from the table according to the current state, it is necessary to find the state of the next codeword so that the modulation will not violate the (d,k) constrain.

In 2000, Lee disclosed, in U.S. Pat. No. 6,604,219, a method to write a multi-level data sequence into a storage medium. When retrieving the multi-level data sequence from the storage medium, the disclosed method can reduce the DC and the low frequency component of the read data. The method estimates a plurality of candidate merge symbols individually to determine the impact on the running digital sum of the read signal from each merge symbol, and selects the preferred merge symbol. The merge symbol is inserted into the multi-level data sequence to control the running digital sum (that is, the DC and the low frequency component) of the read signal. However, the method must increase the length of the merge symbol to entirely control the running digital sum of the signal. Furthermore, the merge symbol may be even longer for connecting codewords when taking the (d,k) constrain into account. All these will reduce the coding rate.

In 2003, Immink disclosed a high performance modulation method in the article "Efficient DC-Free RLL Codes for Optical Recording", appeared in IEEE Transactions on Communications, Vol. 52, No. 3, March 2003. The method design a modulation table for ML3 m/n(d,k), where d=2 and k=8 are the minimum and the maximum of the running length, respectively, m=8 is the information word length, and n=11 is the codeword length. The actual number of levels of the signal is 3.

FIG. 2A shows a part of the ML3 8/11(2,8) modulation table according to the Immink method. As the table is too large, only a small part (user data 44 to 6) is selected for explanation. As shown in FIG. 2A, the modulation table includes three states (S1, S2, S3). The first and the second digits of the codewords belonging to the S1 are both 0. The first digit of the codewords belonging to the S2 is 0, and if the second digit is 0, the third digit must be "X". The first digit of the codewords belonging to S3 is "X". The "X" in LV3 can be either 1 or 2. S3 can be further classified as S30 and S31. That is, when the current state is S3, two corresponding codewords (S30, S31) can be found. The two codewords can be either the same or different. The codeword with the lower DC and low frequency component can be selected for output. In this modulation method, the power spectrum density (PSD) is about −3 dB at the standard frequency $10^{-4}$.

On the other hand, when the current state is S1, it indicates that the trailing 0 of the previous codeword is at least zero. When the current state is S2, it indicates that the trailing 0 of the previous codeword is at least 1. When the current state is S30 or S31, it indicates that the trailing 0 of the previous code word is 2.

Regardless of the current state, the codeword CA and the next state SB can be found in the modulation table according to the user data UA and the current state SA. According to the next user data UB and the codeword belonging to SB, the next codeword CB can be found, and so on. This can complete the modulation of all the user data. In demodulation, because the CA of the state SA may appear more than once, it requires the next state SB to demodulate the UA. CA and the possible SB are listed in FIG. 2B. FIG. 2B shows a relationship diagram between CA and the next state SB in the ML3 8/11(2,8) modulation table.

The coding efficiency of the high performance method is as high as 95%. However, if the coding is based on its modulation table, the function of low frequency component control for the obtained NRZI signals does not meet the requirements of the users.

SUMMARY OF THE INVENTION

The present invention has been made to overcome the aforementioned drawback of conventional methods for recording data to an optical storage medium. The primary object of the present invention is to provide a modulation method with state control codeword insertion. The modulation method of the invention is based on the state modulation to achieve the control of the DC and low frequency component.

The method comprises the steps of: (a) performing run length limited (RLL) state modulation to generate a RLL codeword and store a next state based on a current state, a state modulation table and a user data, the RLL codeword satisfying m/n(d,k) constrain, where m being the length of the data bits, n being the length of the codeword bits, d and k being the minimum and the maximum of the running length, respectively; (b) determining whether to insert state control code, and if not, returning to step (a); otherwise, continuing to step (c), (c) finding a set of corresponding state control codes based on the current state, and (d) selecting and outputting a state control code from the set, and storing a set of next states corresponding to the state control code.

The main feature of the present invention is to insert the state control code based on the conventional state modulation structure for increasing the selection choices toward the codewords. In addition, the state control code can provide, according to the multi-level modulation characteristics, several sets of signals for selection during modulation and to increase the control effect on the low frequency component.

Another object of the present invention is to provide a state modulation apparatus for inserting state control code, comprising a RLL modulation unit, a state control code insertion unit, a first multiplexer, a current state storing unit, a state control modulation table storing unit, a state control code selection unit, a digital sum computing unit, and a second multiplexer.

The RLL modulation unit includes a state modulation table. According to the current state stored in the current state storing unit, the state modulation table, and a user data, the RLL modulation unit performs RLL modulation and outputs a RLL codeword and a next state. The RLL codeword satisfies the m/n (d,k) constrain, where m is the length of the data bits, n is the length of the codeword bits, and d and m are the minimum and the maximum of the running length, respectively. When the state control code insertion unit determines to perform state control code insertion, it outputs two insertion signals. The first multiplexer, according to the insertion signals, select one set of next state from the two input sets of next states for output. The current state storing unit receives the next state from the first multiplexer and outputs the current state to the RLL modulation unit and state control modulation table storing unit.

The state control modulation table storing unit includes a state control modulation table. Based on the current state, the state control modulation table storing unit inquires the state control modulation table and outputs a set of state control code and a set of next state corresponding to the current state. The state control code selection unit receives and outputs, within a first pre-set duration, a set of state control code and a set of next state to the digital sum computing unit, and within a second pre-set duration, receives a set of digital sum, selects and outputs the state control code corresponding to the digital sum with the least absolute value and the set of next state corresponding to the state control code. The digital sum computing unit receives a plurality of parameters, computes and outputs a set of digital sum. The second multiplexer, according to the insertion signals, selects an output from the RLL codeword and the state control code.

The experiments show that when data bit length m=8, codeword bit length n=11, and no additional state control code, the PSD is about −3 dB at the frequency $10^{-4}$. However, when a one-bit state control code is added to the tail of each codeword, the coding rate is reduced by $\frac{1}{12}$, but the PSD is about −35 dB at the frequency $10^{-4}$. When a one-bit state control code is added to the tail of each two-codewords, the coding rate is reduced by $\frac{1}{23}$, but the PSD is about −25 dB at the frequency $10^{-4}$, which is still within the demands of general design requirements. The coding rate is about 1.39 times of that of the digital video disk (DVD). Therefore, the present invention is proved to increase the control effect of the low frequency component.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIG. 2A shows a part of an ML3 8/11 (2,8) modulation table according to the Immink method.

DETAILED DESCRIPTION OF THE PREFERRED EMBODIMENTS

Figure 3A:
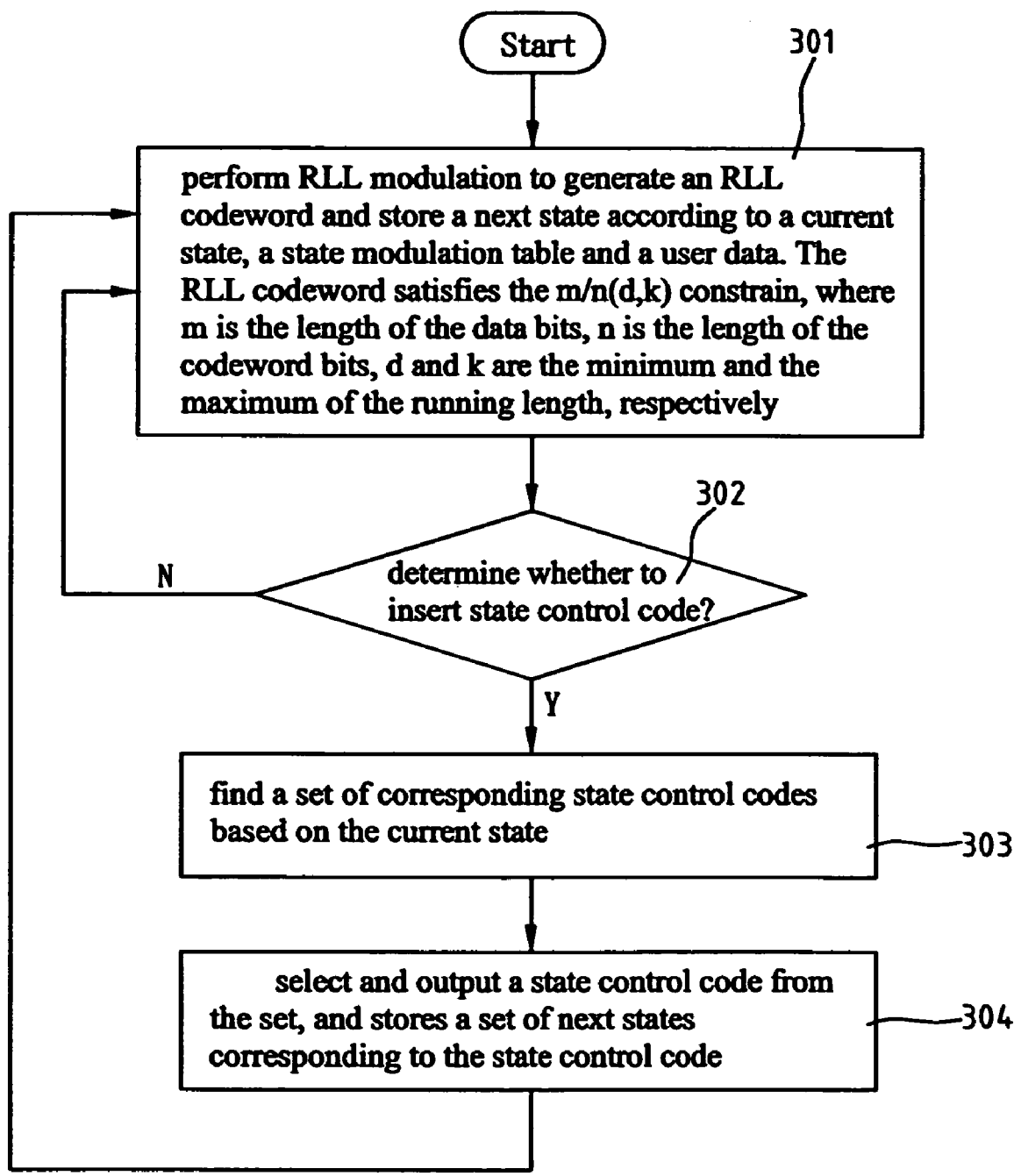
FIG. 3A shows a flowchart of the state modulation method for inserting state control code according to the invention.

FIG. 3A shows a flowchart of the state modulation method of the present invention. As shown in FIG. 3A, step 301 is to perform RLL modulation to generate a RLL codeword and store a next state according to a current state, a state modulation table and a user data The RLL codeword satisfies the m/n(d,k) constrain, where m is the length of the data bits, n is the length of the codeword bits, d and k are the minimum and the maximum of the running length, respectively. Step 302 is to determine whether to insert state control code. If not, return to step 301; otherwise, continue to step 303. Step 303 is to find a set of corresponding state control codes based on the current state. Step 304 is to select and output a state control code from the set, and stores a set of next states corresponding to the state control code, and then returns to step 301.

Figure 3B:
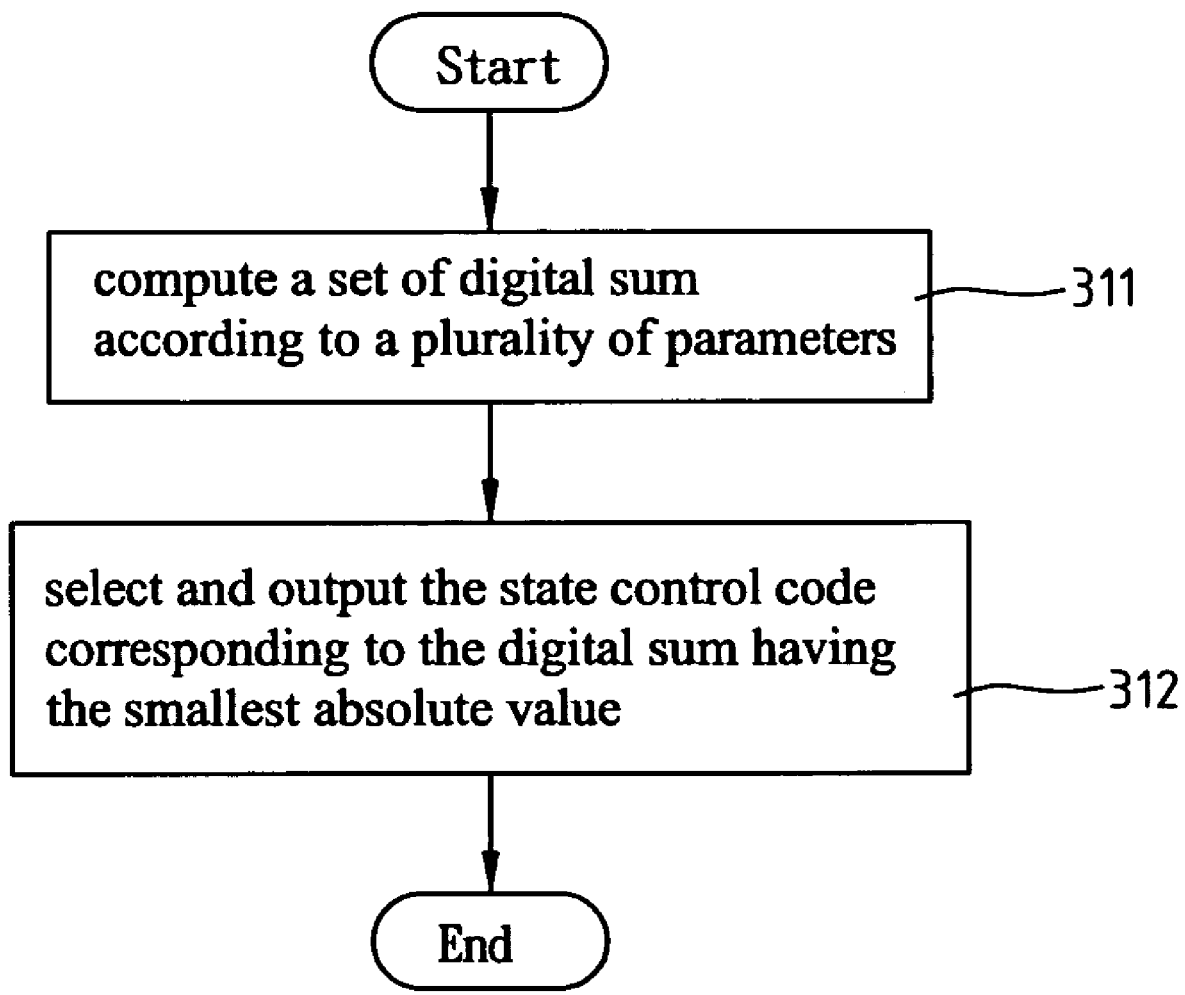
FIG. 3B shows the selection and output of step 304 of the flowchart of FIG. 3A.

FIG. 3B shows the selection and the output of step 304 of FIG. 3A. Step 311 is to compute a set of digital sum according to a plurality of parameters. Step 312 is to select and output the state control code corresponding to the digital sum having the smallest absolute value. The plurality of parameters in step 311 include the set of state control code, the set of next state, at least a RLL codeword and a set of next state corresponding to the next user data. Alternatively, they include the set of state control code, the set of next state, a plurality of RLL codewords and a plurality of sets of next state corresponding to the next several user data (will be explained in FIG. 6).

Figure 1:
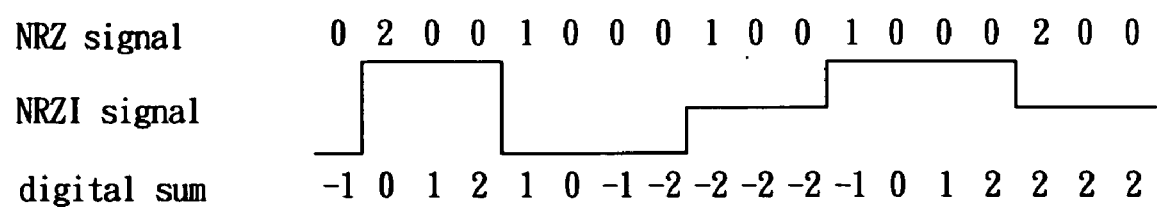
FIG. 1 shows the NRZ signal, NRZI signal and the changes of the digital sum.
Figure 2B:
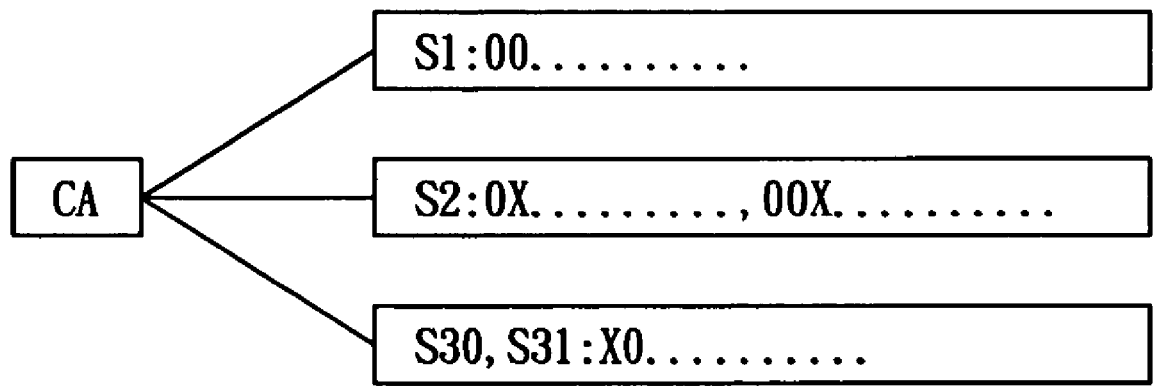
FIG. 2B shows the relationship diagram between codeword CA and next state SB of the ML3 8/11 (2,8) modulation table.
Figures 4A, 4B:
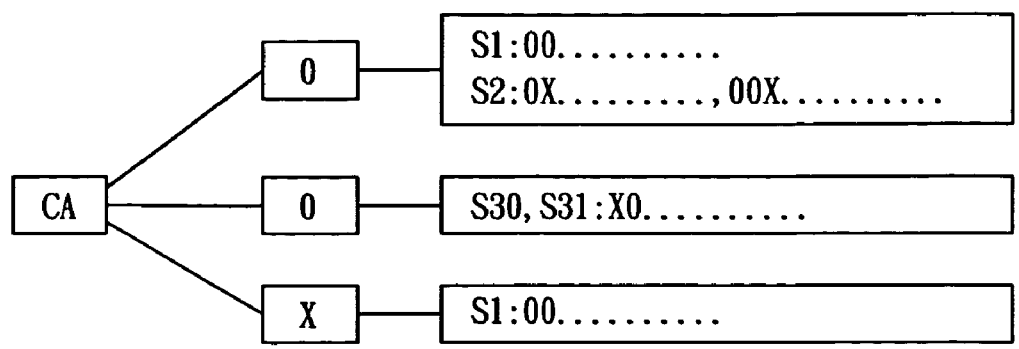
FIG. 4A shows the relationship among codeword CA, state control code and next state SB after inserting the state control code.
FIG. 4B shows the state control code table.

FIG. 4A shows the relationship between the codeword CA, the state control code and the next state SB after the insertion of the state control code. After the insertion of a state control code between codeword CA and codeword CB, for correct demodulation, the inserted state control code must have the state characteristics and satisfy the m/n (d,k) constrain. Therefore, the codeword CA, the state control code and the next state SB form the relationship shown in FIG. 4A. In conventional state modulation methods, if the codeword after the codeword CA belongs to S1 (as shown in FIGS. 2A and 2B), one codeword belonging to S1 and one codeword belonging to S2 can be selected from the modulation table to become the next-codeword CBs because a one-bit 0 is added behind the codeword CA as the state control code. The two next-selected-codeword CBs are further selected and compared with the one having the better control effect of the DC and low frequency component while satisfying the m/n (d,k) constrain.

Similarly, in conventional state modulation methods, if the codeword after the codeword CA belongs to S2 (as shown in FIGS. 2A and 2B), one codeword belonging to S30 and one codeword belonging to S31 can be selected as to become next codeword CB's from the modulation table because a one-bit 0 is added behind the codeword CA as the state control code. The two next-selected-codeword CBs can be either identical or different from each other. The two next-selected-codeword CBs are further selected and compared with the one having the better control effect of the DC and low frequency component while satisfying the m/n (d,k) constrain. In conventional state modulation methods, if the codeword after the codeword CA belongs to S3 (as shown in FIGS. 2A and 2B), one codeword belonging to S1 can be selected from the modulation table to become the next codeword CB because a one-bit X is added behind the codeword CA as the state control code. X can be either 1 or 2. The determination of X being 1 or 2 depends on the control effect of the DC and low frequency component.

The aforementioned correspondence between the current state and the state control code and the next state can be summarized as the state control modulation table shown in FIG. 4B. The state control modulation table 400 includes three fields, a current state field 401, a state control code field 402, and a next state field 403. As the state control modulation table in FIG. 4B is derived from the state modulation table in FIG. 2A, the number of the states (S1–S3) of current state field 401 is the same as the number of the states (S1–S3) in state modulation table in FIG. 2A. In addition, each current state corresponds to a set of state control codes. For example, current state S1 corresponds to a state control code 0, and current state S3 corresponds to state control codes 1 and 2. Each state control code also corresponds to a set of next states. For example, current state S1 and state control code 0 correspond to next states S1 and S2. Current state S2 and state control code 0 correspond to next states S30 and S31. Furthermore, state control code field 402 at least includes a set of state control codes, which further include at least two state control codes. For example, current state S3 corresponds to state control code 1 or 2. State control code field 402 at least includes a state control code, which corresponds to at least two next states. For example, current state S1 and state control code 0 correspond to two next states, namely, S1 and S2.

It is worth noticing that there are numerous designs for the current state modulation table, and the table shown in FIG. 2A is only an embodiment. Different current state modulation tables will lead to different state control modulation tables. The premise is that after inserting the state control code, all the state control codes and codewords must satisfy the m/n (d,k) constrain in the original state modulation table. All the state control modulation tables have the same three fields, and every state control modulation table has the same number of current states as the state modulation table they correspond to. However, each current state in different state control modulation tables may correspond to different number of state control codes, and each state control code may correspond to different number of next states.

Figure 5:
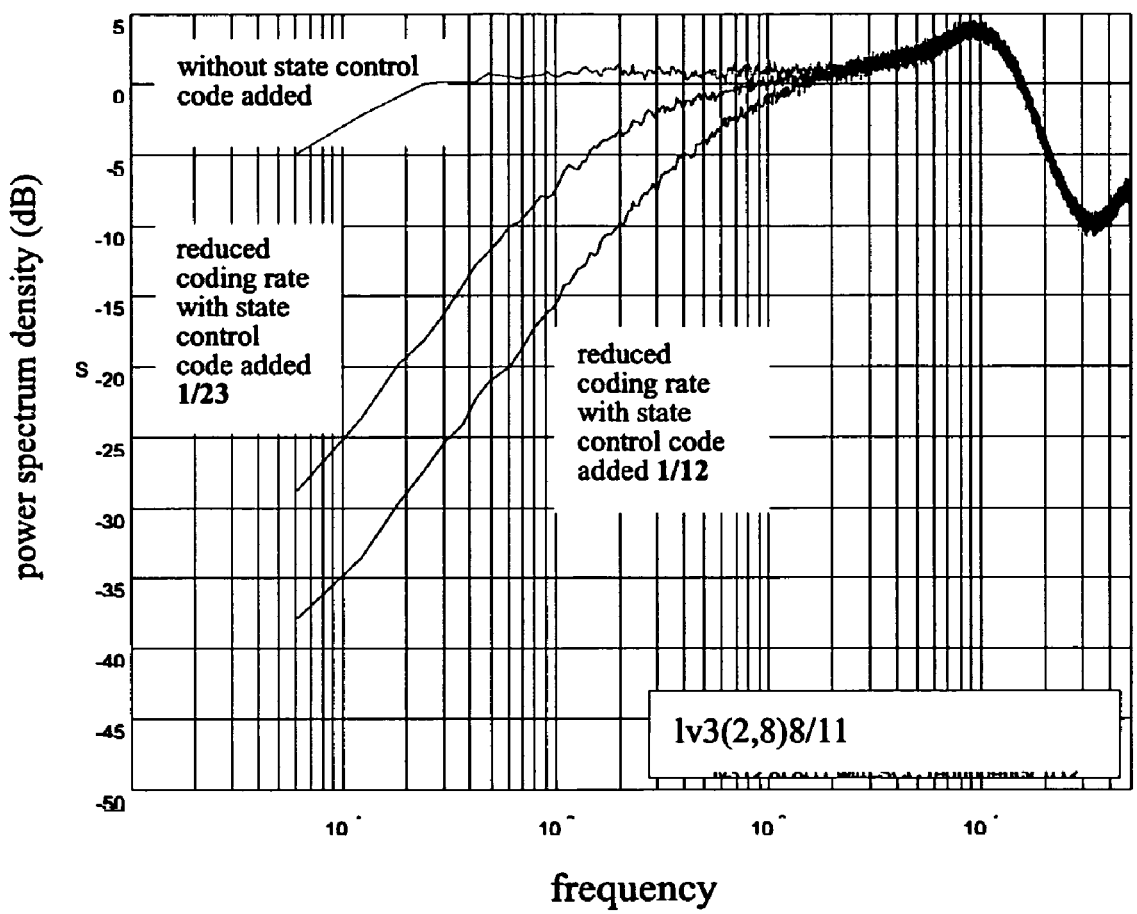
FIG. 5 shows the comparison of the power spectrum density for three different situations, including no-added state control code, a one-bit state control code for each codeword, and a two-bit state control code for each codeword when m=8 and n=11.

FIG. 5 shows the situation when m=8 and n=11, the power spectrum density (PSD) in three situations, including no state control code added, a one-bit state control code added for each codeword, and a one-bit state control code added for each two-codeword. As shown in FIG. 5, when data bit length m=8, codeword bit length n=11, and no additional state control code, the PSD is about −3 dB at the frequency $10^{-4}$. However, when a one-bit state control code is added to the tail of each codeword, the coding rate is reduced by $\frac{1}{12}$, but the PSD is about −35 dB at the frequency $10^{-4}$. The coding rate is about 1.33 times of that of digital video disk. When a one-bit state control code is added to the tail of each two-codeword, the coding rate is reduced by $\frac{1}{23}$, but the PSD is reduced to −25 dB at the frequency $10^{-4}$, which is still within the demands of general design requirements. The coding rate is about 1.39 times of that of the digital video disk.

Figure 6:
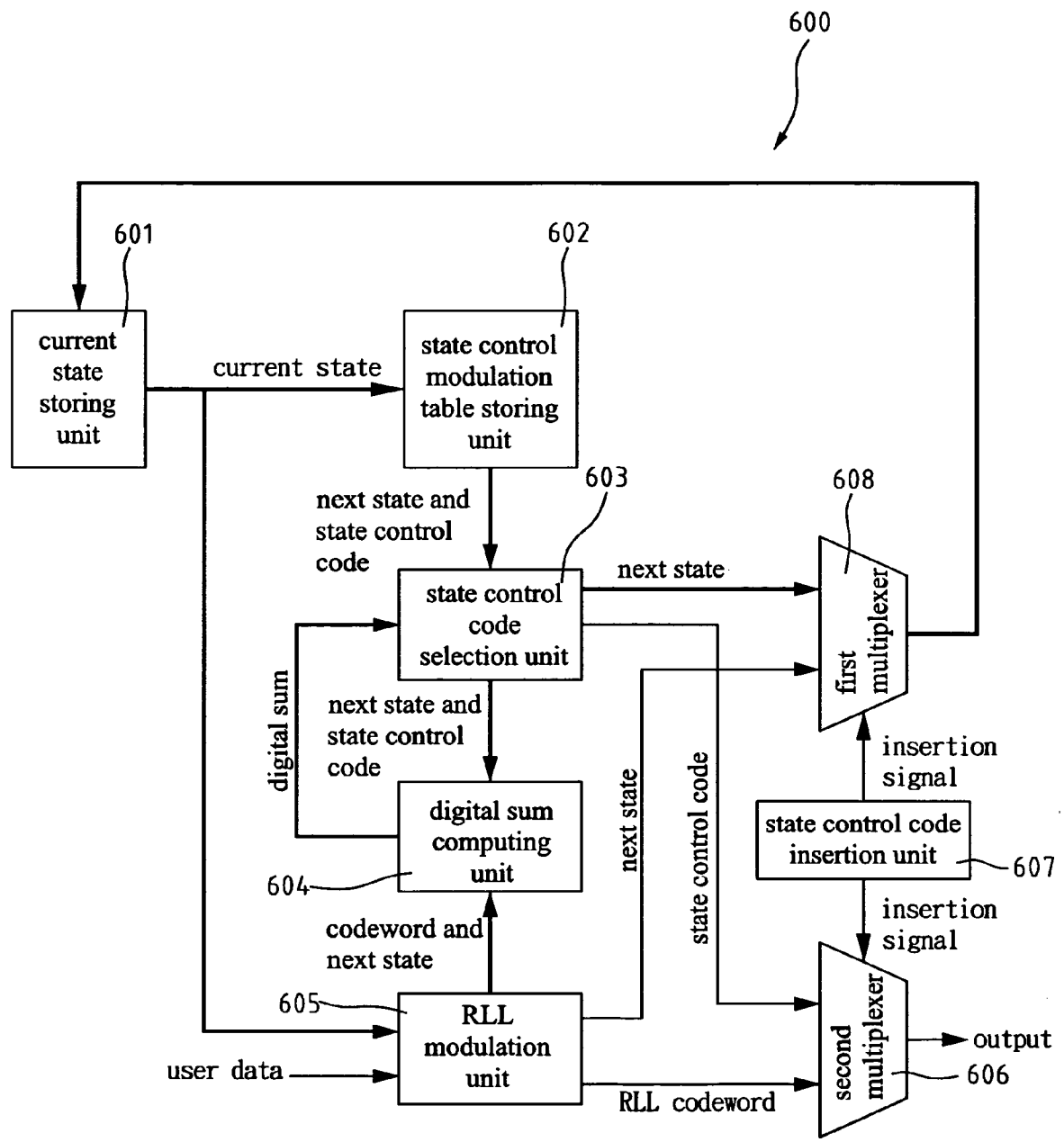
FIG. 6 shows a schematic view of the state modulation apparatus for inserting state control code according to the invention.

FIG. 6 shows a schematic view of a state modulation apparatus for inserting state control code. As shown in FIG. 6, a state modulation apparatus 600 includes a RLL modulation unit 605, a state control code insertion unit 607, a first multiplexer 608, a current state storing unit 601, a state control modulation table storing unit 602, a state control code selection unit 603, a digital sum computing unit 604, and a second multiplexer 606.

RLL modulation unit 605 includes a state modulation table. According to the current state outputted by current state storing unit 601, the state modulation table, and a user data, RLL modulation unit 605 performs RLL modulation and outputs a RLL codeword and a next state. The RLL codeword satisfies the m/n (d,k) constrain, where m is the length of the data bits, n is the length of the codeword bits, and d and m are the minimum and the maximum of the running length, respectively. When state control code insertion unit 607 determines to perform state control code insertion, it outputs two insertion signals to first multiplexer 608 and second multiplexer 606. According to the insertion signals, the first multiplexer 608 selects one set of next states from the two input sets of next states for output. Current state storing unit 601 receives the next state from first multiplexer 608, and outputs the current state to RLL modulation unit 605 and state control modulation table storing unit 602.

State control modulation table storing unit 602 includes a state control modulation table. Based on the current state, state control modulation table storing unit 602 inquires the state control modulation table and outputs a set of state control codes and a set of next states corresponding to the current state. State control code selection unit 603 receives and outputs, within a first pre-set duration, a set of state control codes and a set of next states to digital sum computing unit 604, and within a second pre-set duration, receives a set of digital sum from digital sum computing unit 604, selects and outputs the state control code corresponding to the digital sum with the least absolute value and the set of next state corresponding to the state control code to first multiplexer 608. Digital sum computing unit 604 receives a plurality of parameters, computes and outputs a set of digital sum. According to the insertion signals, the second multiplexer 606 selects an output from the RLL codeword and the state control code.

Without greatly reducing the coding rate, the present invention improves the control effect of the DC and low frequency component in the conventional modulation methods. To achieve the object, digital sum computing unit 604 includes a look-ahead capability. The look ahead capability not only allow using the RLL codeword and the next state corresponding to the next user data, but also allows using a plurality of RLL codewords and a plurality of next states corresponding to a plurality of next user data. State control code selection unit 603, according to the digital sum computed with the look-ahead capability, determines the most suitable state control code and the corresponding next state. With the look-ahead capability, the present invention can collect more user data for a better decision based on the selection of state control code and next state. For longer term, the DC and low frequency component can be better controlled.

In summary, the state control code insertion of the present invention can change the next state or increase the number of next state for choosing, which leads to the increase of subsequent codeword selections. For example, as shown in FIG. 2B, the convention method has only one next state S1 when the current state is S1. But with the present invention, as shown in FIG. 4A, there are two next states S1 and S2 for selection when the current state is S1. Furthermore, the state control code can also provide, through the multi-level modulation characteristics, several sets of signals, such as the 1 and 2 shown in FIG. 4B. Both can improve the control effect of the DC and low frequency component.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A state modulation method for inserting state control code, comprising the steps of:
   (a) performing run length limited (RLL) state modulation to generate a RLL codeword and store a next state based on a current state, a state modulation table and a user data, said RLL codeword satisfying m/n (d,k) constrain, where m being the length of said data bits, n being the length of said codeword bits, and d and k being the minimum and the maximum of the running length, respectively;
   (b) determining whether to insert a state control code, and if not, returning to step (a); otherwise, continuing to step (c);
   (c) finding a set of corresponding state control codes based on said current state and a state control modulation table; and
   (d) selecting and outputting a state control code from said set, and storing a set of next states corresponding to said state control code, and then returning to step (a).

2. The method as claimed in claim 1, wherein said step (d) further comprises:
   (d1) computing a set of digital sum, according to a plurality of parameters; and
   (d2) selecting and outputting said state control code corresponding to a digital sum of said set having the smallest absolute value.

3. The method as claimed in claim 1, wherein said state control modulation table at least comprises a current state field, a state control code field, and a next state field, each said current state corresponds to a set of state control codes, each said state control code corresponds to a set of next states, and the number of current states in said current state field is equal to the number of states in said state modulation table.

4. The method as claimed in claim 3, wherein said state control code field at least comprises a set of state control codes, and said set comprises at least two state control codes.

5. The method as claimed in claim 3, wherein said state control code field at least comprises a state control code, and said state control code corresponds to a set of at least two next states.

6. The method as claimed in claim 3, wherein each said current state in said state control modulation table and corresponding set of state control codes must satisfy d's constrain.

7. The method as claimed in claim 3, wherein each said control code in said state control modulation table and corresponding set of next states must satisfy d's constrain.

8. The method as claimed in claim 2, wherein said plurality of parameters of step (d1) comprise said set of state control codes, said set of next states, at least a RLL codeword and a next state set corresponding to the next user data.

9. The method as claimed in claim 2, wherein said plurality of parameters of step (d1) comprise said set of state control codes, said set of next states, a plurality of RLL codewords and a plurality of next state sets corresponding to a plurality of next user data.

10. The method as claimed in claim 1, wherein m=8, n=11, d=2, and k=8.

11. The method as claimed in claim 1, wherein said RLL state modulation in step (a) is a multi-level RLL modulation.

12. The method as claimed in claim 11, wherein said multi-level RLL modulation has three levels.

13. A state modulation apparatus with state control code insertion, comprising:
   a RLL modulation unit, having a state control code table, for outputting a RLL codeword and a next state according to a current state, said state control code table and a user data, said RLL codeword satisfying m/n (d,k) constrain, m being the length of said data bits, n being the length of said codeword bits, d and k being the minimum and maximum of running length;

a state control code insertion unit, for outputting two insertion signals when determining to perform state control code insertion;

a first multiplexer, for selecting and outputting a set of next states from two sets of next states according to said insertion signal;

a current state storing unit, for outputting a current state, and receiving and storing a next state from said first multiplexer;

a state control modulation table storing unit, having a state control modulation table, said unit, based on the current state, inquiring said state control modulation table and outputting a set of state control codes and a set of next states corresponding to said current state;

a state control code selection unit, for receiving and outputting a set of state control codes and a set of next states within a first pre-set duration, and within a second pre-set duration, receiving a set of digital sum, selecting and outputting a state control code corresponding to the digital sum with the least absolute value and a set of next states corresponding to said state control code;

a digital sum computing unit, for receiving a plurality of parameters, computing and outputting a set of digital sum; and a second multiplexer, according to said insertion signal, for selecting and outputting one of said RLL codeword and said state control code.

14. The apparatus as claimed in claim 13, wherein said state control modulation table at least comprises a current state field, a state control code field and a next state field, each said current state corresponds to a set of state control codes, each said state control code corresponds to a set of next states, and the number of current states in said current state field is equal to the number of states in said state modulation table.

15. The apparatus as claimed in claim 14, wherein said state control code field at least comprises a set of state control codes, and said set comprises at least two state control codes.

16. The apparatus as claimed in claim 14, wherein said state control code field at least comprises a state control code, and said state control code corresponds to a set of at least two next states.

17. The apparatus as claimed in claim 14, wherein each said current state in said state control modulation table and corresponding set of state control codes must satisfy d's constrain.

18. The apparatus as claimed in claim 14, wherein each said control code in said state control modulation table and corresponding set of next states must satisfy d's constrain.

19. The apparatus as claimed in claim 13, wherein said plurality of parameters comprise said set of state control codes, said set of next states, at least a RLL codeword and a next state set corresponding to the next user data.

20. The apparatus as claimed in claim 13, wherein said plurality of parameters comprise said set of state control codes, said set of next states, a plurality of RLL codewords and a plurality of next state sets corresponding to a plurality of next user data.

* * * * *